United States Patent [19]
Lee

[11] Patent Number: 5,955,380
[45] Date of Patent: Sep. 21, 1999

[54] ENDPOINT DETECTION METHOD AND APPARATUS

[75] Inventor: Gill Yong Lee, Fishkill, N.Y.

[73] Assignee: Siemens Aktiengesellschaft, Munich, Germany

[21] Appl. No.: 08/941,093

[22] Filed: Sep. 30, 1997

[51] Int. Cl.$^6$ .................................................. H01L 21/20
[52] U.S. Cl. .................... 438/706; 438/735; 438/737; 438/738; 438/740
[58] Field of Search .................................. 438/740, 738, 438/737, 735, 706

[56] References Cited

U.S. PATENT DOCUMENTS

| | | | |
|---|---|---|---|
| 5,707,901 | 1/1998 | Cho et al. | 438/595 |
| 5,869,404 | 2/1999 | Kim et al. | 438/738 |

*Primary Examiner*—Benjamin Utech
*Assistant Examiner*—Vanessa Pérez-Ramos
*Attorney, Agent, or Firm*—Stanton C. Braden

[57] ABSTRACT

Disclosed are metal fuse structures and methods for making the same. The method includes forming the fuse structure from a metallization layer. Depositing a bottom oxide layer, that is an HDP oxide, over the fuse structure that is formed from the metallization layer. Depositing a doped oxide layer over the base oxide layer. Depositing a top oxide layer over the doped oxide layer. Etching through the top oxide layer. Detecting an increased level of a dopant species that is emitted when the doped oxide layer begins to etch. The method further includes terminating the etching when the increased level of dopant species is detected. Wherein at least the bottom oxide layer remains over the fuse structure that is formed from the metallization layer.

12 Claims, 4 Drawing Sheets

ENDPOINT DETECTION METHOD AND APPARATUS

BACKGROUND OF THE INVENTION

1. Field of the Invention

The present relates to the design and manufacture of semiconductor devices. More particularly, the present invention relates to improved techniques for detecting etch endpoints in metal fuse fabrication.

2. Description of the Related Art

There are a significant number of integrated circuit applications that require some sort of programmable memory for storing information. A common way of programmably storing data on an integrated circuit chip is to design what are known as "metal fuses." Metal fuses are typically patterned from existing metallization layers that are fabricated over dielectric layers of a silicon wafer. By way of example, after a metallization layer is deposited over a dielectric layer, a spin-coating process is used to apply a photoresist over the metallization layer.

The photoresist layer is then patterned with a reticle-stepper apparatus, which is used to transfer a desired pattern to the photoresist layer. Once patterned (i.e., exposed and developed), the photoresist will resemble a mask that leaves exposed certain regions of the underlying metallization, while still covering other portions of the metallization layer. Next, an etching operations is performed to remove portions of the metallization layer where the photoresist was not present. At this point, the metallization layer will have been patterned to define any number of features, such as interconnection lines and metal fuse structures. The metallization layer may then be covered with a dielectric layer, and terminal via (TV) holes etched down close to the metal fuse structures. However, in metal fuse technology, there is a general requirement that a certain thickness of dielectric layer remain over the metal fuse structure to ensure appropriate functionality.

A common problem in etching the terminal vias is that the amount of dielectric material overlying the metal fuse structures varies in thickness depends on the type of deposition technique used, the location of neighboring features and the region of the wafer being patterned. As a result, the timed etching processes have to be varied to take into account these and other factors. Unfortunately, such variations in the formation of the terminal vias may translate into substantial losses in productivity as well as damaged metal fuse structures. That is, if the terminal via etching operation removes too much of the overlying dielectric, or etches down into the metallization layer, the metal fuse structure may become too damaged to work for its intended purpose.

With this in mind, FIG. 1 shows a cross-sectional view of a semiconductor wafer 100 having a number of layers fabricated thereon. As shown, a dielectric layer 102 is commonly deposited over the semiconductor wafer 100 to a thickness that sufficiently insulates any active devices patterned throughout the semiconductor wafer 100. Once the dielectric layer 102 has been deposited, a metallization layer is formed over the dielectric layer 102 and patterned in the aforementioned method to form a metallization feature 104.

In this example, the metallization feature 104 is fabricated in the form of a metal fuse structure that may be programmed to store bit data or interconnect devices. In a next step, an oxide layer 106 is deposited over the metallization feature 104, as well as over other features throughout the semiconductor wafer. As mentioned above, it is a common requirement that an amount of oxide, e.g., to a level 120 remain over the metallization feature 104 to enable appropriate programming. In typical cases, the level 120 of oxide that remains should range between about 1,000 angstroms and 3,000 angstroms.

Of course, if the underlying metallization feature 104 (which may be a metal fuse structure) becomes exposed, the programming integrity of the metal fuse structure will suffer due to the inability to control the trench via etching operation over varying oxide thicknesses. Although fuse designers typically implement timed etching techniques, the timing parameters vary with oxide thicknesses. As such, the timing techniques will many times fail to accurately detect a desired end-point when performing terminal via etching.

In view of the foregoing, there is a need for a method and apparatus for forming terminal vias in metal fuse structures without over-etching overlying oxide materials. There is also a need for metal fuse structures that improve stress migration problems in underlying metallization layers.

SUMMARY OF THE INVENTION

Broadly speaking, the present invention fills these needs by providing a method and apparatus that improves the process of forming terminal vias over metal fuse structures in devices having varying oxide thicknesses. In a further embodiment, a method for detecting an etch end-point during the formation of terminal vias, while simultaneously improving stress migration problems is disclosed. It should be appreciated that the present invention can be implemented in numerous ways, including as a process, an apparatus, a system, a device, or a method. Several inventive embodiments of the present invention are described below.

In one embodiment, a method of forming a terminal via in a fuse structure is disclosed. The method includes forming the fuse structure from a metallization layer. Depositing a bottom oxide layer that is an HDP oxide over the fuse structure that is formed from the metallization layer. Depositing a doped oxide layer over the base oxide layer. Depositing a top oxide layer over the doped oxide layer. Etching through the top oxide layer. Detecting an increased level of a dopant species that is emitted when the doped oxide layer begins to etch. The method further includes terminating the etching when the increased level of dopant species is detected. Wherein at least the bottom oxide layer remains over the fuse structure that is formed from the metallization layer.

In another embodiment, a metal fuse structure is disclosed. The structure includes a fuse structure that is patterned from a metallization layer. A base oxide layer lying over the fuse structure, the base oxide layer having a thickness of between about 500 angstroms and about 2,000 angstroms. An etch stop signal layer lying over the base oxide layer. A top oxide layer lying over the etch stop signal layer. The structure further includes a terminal via that is defined through the top oxide layer that lies over the fuse structure. Wherein the terminal via is not defined past the etch stop layer, and the base oxide layer lying over the fuse structure remains.

In yet another embodiment, a metal fuse structure is disclosed. The structure includes a fuse structure that is patterned from a metallization layer. A base oxide layer lies over the fuse structure, and the base oxide layer has a thickness of between about 500 angstroms and about 2,000 angstroms. A spin-on-glass etch stop layer lies over the base oxide layer. A top oxide layer lies over the spin-on-glass etch stop layer. The structure further includes a terminal via that is defined through the top oxide layer that lies over the fuse structure, such that the terminal via is not defined past the spin-on-glass etch stop layer, and the base oxide layer lying over the fuse structure remains.

Advantageously, when metal fuse structures maintain a sufficient amount of oxide over the terminal vias, the metal fuse structures will operate substantially better in a number of applications, which may include cell replacement in DRAM devices, programming bit data or micro-code onto a chip, etc. Therefore, the combined ability to maintain a desired amount of oxide over a terminal via (regardless of variations in oxide) and the introduction of less compressive materials in the intermetal dielectric layers will improve fuse performance and reduce stress migration in underlying metallization features. Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE INVENTION

The invention relates to the formation of terminal vias for use in integrated circuits (ICs). Such ICs include, for example, random access memories (RAMs), dynamic RAMs (DRAMs), a synchronous DRAM (SDRAM), read only memories (ROMs). Other Ics, such as application specific ICs (ASICs), merged DRAM-logic circuits (embedded DRAMs), or other logic circuits, are also useful.

Typically, numerous ICs are formed on the wafer in parallel. After processing is finished, the wafer is diced to separate the ICs to individual chips. The chips are then packaged, resulting in a final product that is used in, for example, consumer products such as computer systems, cellular phones, personal digital assistants (PDAs), and other electronic products.

In accordance with the invention, an improved process of forming terminal vias over metal fuse structures in devices having varying oxide thicknesses is disclosed. In another embodiment, a method for detecting when an etch end-point is reached in the formation of terminal vias, while introducing a self-stress relief component into a multi-level intermediate dielectric process is also disclosed. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1:
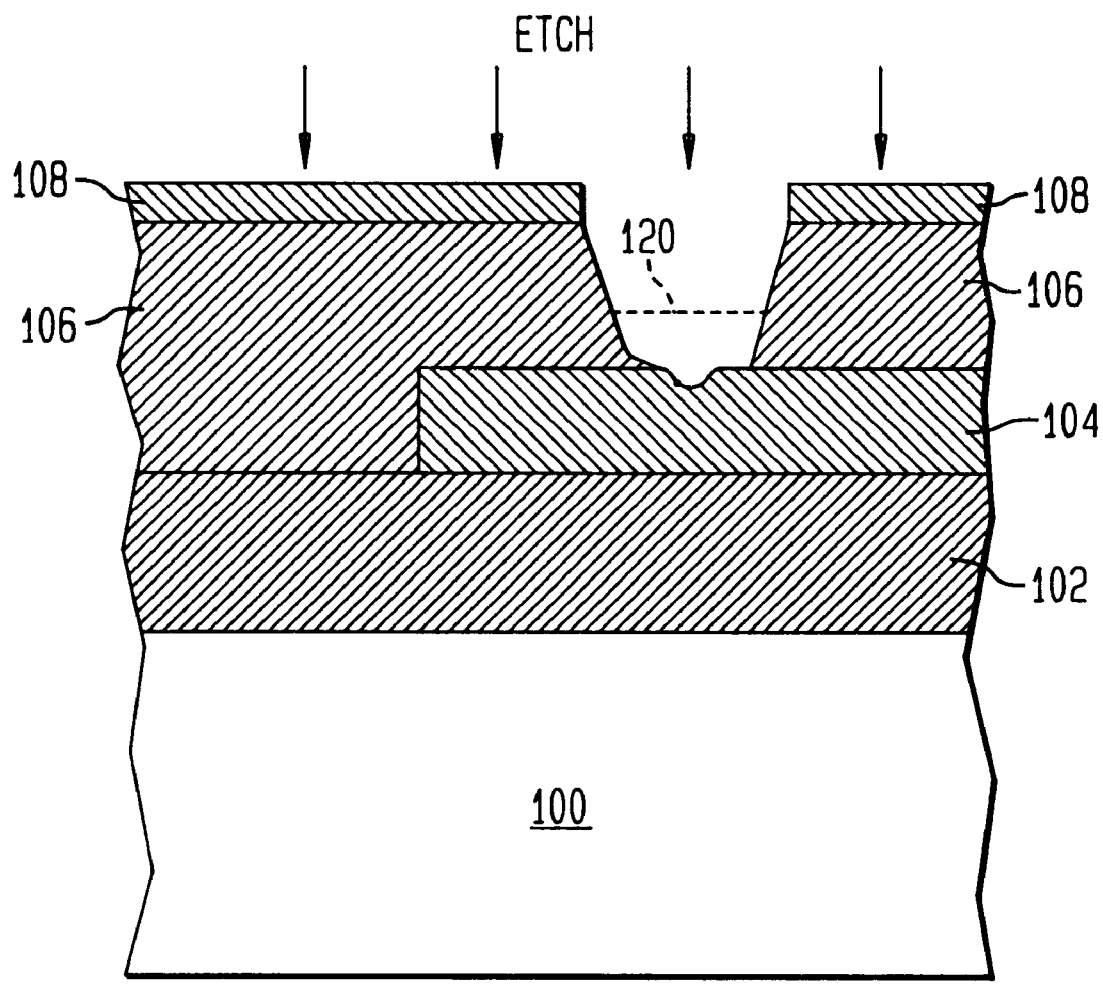
FIG. 1 shows a cross-sectional view of a semiconductor wafer having a terminal via over-etched into an underlying metal fuse metallization layer.
Figure 2:
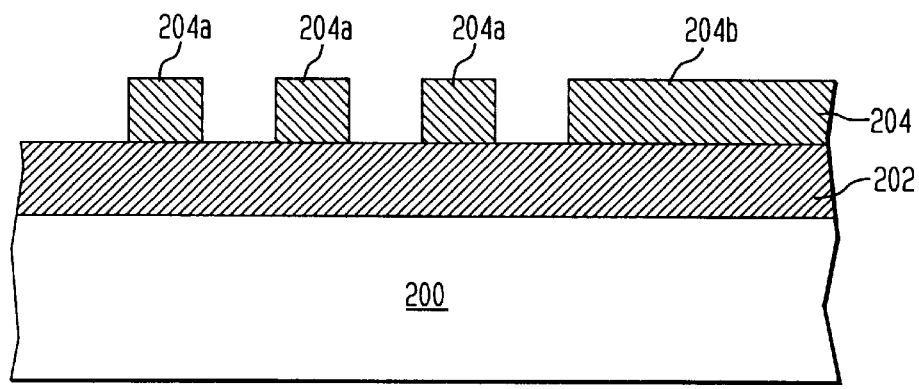
FIG. 2 shows a cross-sectional view of a semiconductor wafer having a first oxide layer deposited thereon in accordance with one embodiment of the present invention.

FIG. 2 shows a cross-sectional view of a semiconductor wafer 200 having a first oxide layer 202 deposited thereon in accordance with one embodiment of the present invention. Typically, the first oxide layer 202 is deposited using a conventional chemical vapor deposition (CVD) method for depositing oxide material to a desired level. Once deposited, the first oxide layer 202 may be planarized using any number of techniques, including a conventional chemical mechanical polishing (CMP) technique that produces a substantially flat oxide surface. Once the CMP operation is performed, a metallization material is blanket deposited over the first oxide layer 202 using any number of conventional metal deposition techniques, such as sputtering or the like. The metallization material is then patterned using a photoresist mask (not shown), that enables the formation of features 204a and 204b on the metallization layer 204.

Figure 3:
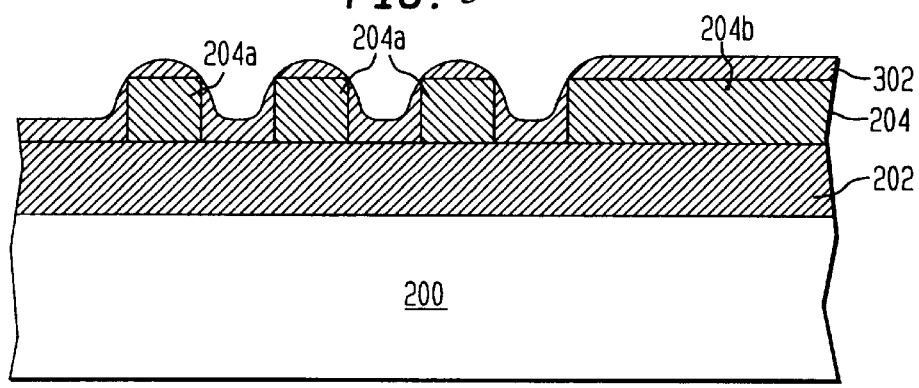
FIG. 3 shows a cross-sectional view of FIG. 2 after a high density plasma (HDP) oxide layer is deposited over the first oxide layer and the metallization layer in accordance with one embodiment of the present invention.

FIG. 3 shows a cross-sectional view of FIG. 2 after a high density plasma (HDP) oxide layer 302 is deposited over the first oxide layer 202 and the metallization layer 204. As is well known in the art, HDP oxide is one of the best gap filling processes used for intermetal dielectric applications. In one embodiment, the HDP oxide 302 is deposited to a thickness of between about 500 angstroms and about 5,000 angstroms, and more preferably between about 1,000 angstroms and 3,000 angstroms, and most preferably deposited to a thickness of about 2,000 angstroms. As can be appreciated, by applying the HDP oxide layer 302, a good conformal gap filling occurs between the closely patterned metallization features 204a.

Figure 4:
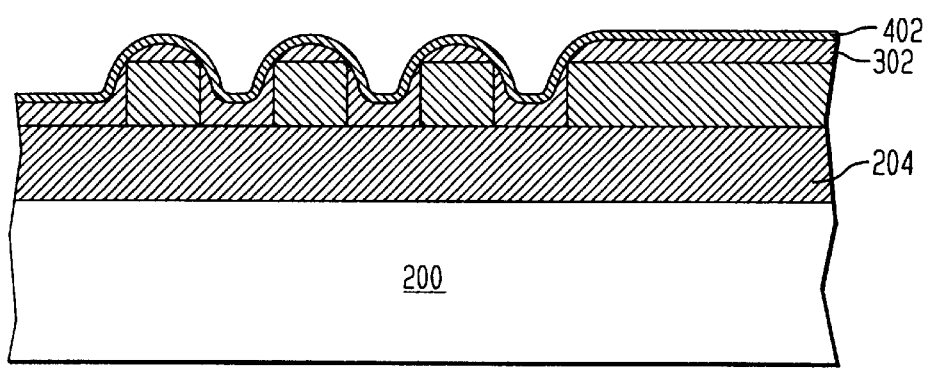
FIG. 4 is a cross-sectional view of the semiconductor wafer of FIG. 3 after a fluorine (F) doped HDP oxide layer is deposited over the HDP oxide layer in accordance with one embodiment of the present invention.

FIG. 4 is a cross-sectional view of the semiconductor wafer 200 of FIG. 3 after a fluorine (F) doped HDP oxide layer 402 is deposited over the HDP oxide layer 302. In general, the fluorine doped HDP oxide layer 402 has a tensile stress or at least one order less compressive than non-doped HDP oxides. Therefore, the fluorine dopant will act as a built-in stress relief for the intermetal dielectric layers formed over the metallization layer 204. In one embodiment, the fluorine doped HDP oxide layer 402 is preferably deposited to a thickness of between about 100 angstroms and about 2,000 angstroms, and more preferably 300 angstroms and 1,000 angstroms, and most preferably about 500 angstroms. In addition, the fluorine concentration in the fluorine-doped HDP oxide layer 402 is between about 2% wt. and about 20% wt., and most preferably between about 3% wt. and about 8% wt., and most preferably about 5% wt. It should be understood that although an HDP-type oxide is deposited for layer 402, other oxides, such as a CVD oxide and PECVD oxide may also be deposited as a doped material with the above-identified concentrations.

Figure 5:
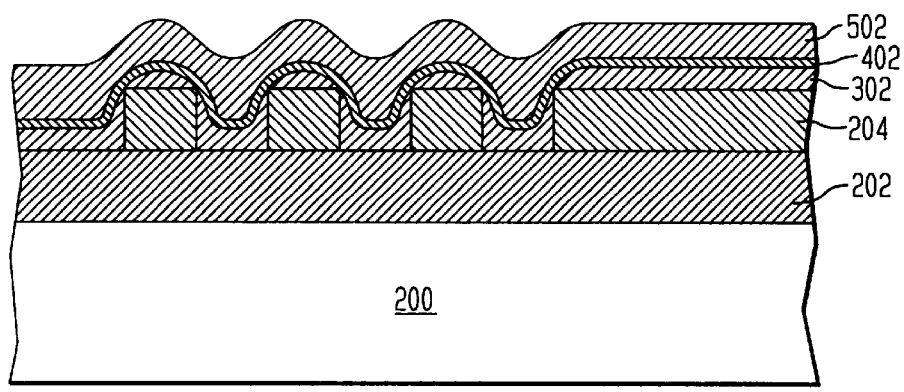
FIG. 5 shows a cross-sectional view of the semiconductor wafer of FIG. 4 after another HDP oxide layer is deposited over the fluorine doped HDP oxide layer in accordance with one embodiment of the present invention.
Figure 6:
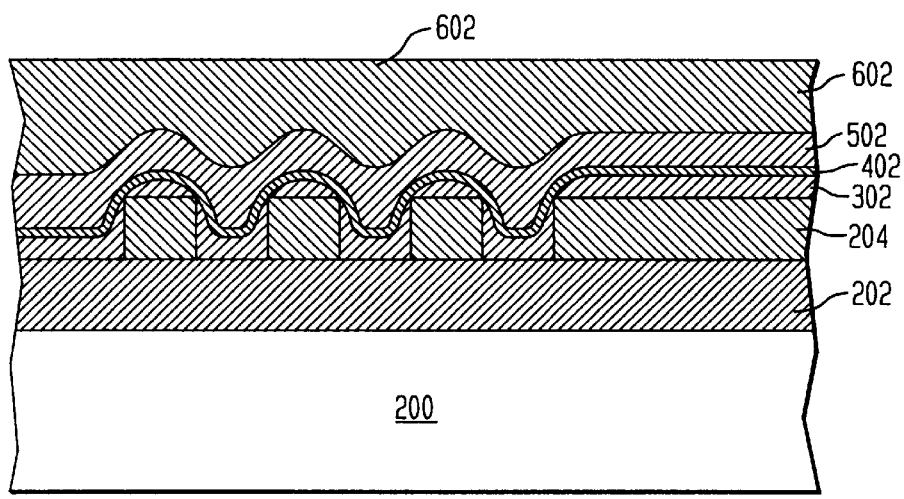
FIG. 6 shows a cross-sectional view of the semiconductor wafer of FIG. 5 after another oxide layer is deposited followed by a CMP process in accordance with one embodiment of the present invention.

FIG. 5 shows a cross-sectional view of the semiconductor wafer of FIG. 4 after another HDP oxide layer 502 is deposited over the fluorine doped HDP oxide layer 402. Generally, the HDP oxide layer 502 is deposited to a thickness of between about 500 angstroms and about 5,000 angstroms, and more preferably between about 1,000 angstroms and about 3,000 angstroms, and most preferably about 1,500 angstroms. Once the HDP oxide layer 502 is deposited to a suitable thickness, a silane ($SiH_4$) oxide chemical vapor deposition (CVD) is performed to deposit an oxide layer 602 as shown in FIG. 6. Preferably, the oxide layer 602 is deposited to a thickness of between about 3,000 angstroms and about 10,000 angstroms, and more preferably between about 4,000 angstroms and about 7,500 angstroms, and most preferably about 6,500 angstroms. Once deposited, the oxide layer 602 is subjected to a chemical mechanical polishing (CMP) to planarize the top surface of the oxide layer 602 to enable further processing, such as the deposition and patterning of additional metallization layers.

Figure 7A:
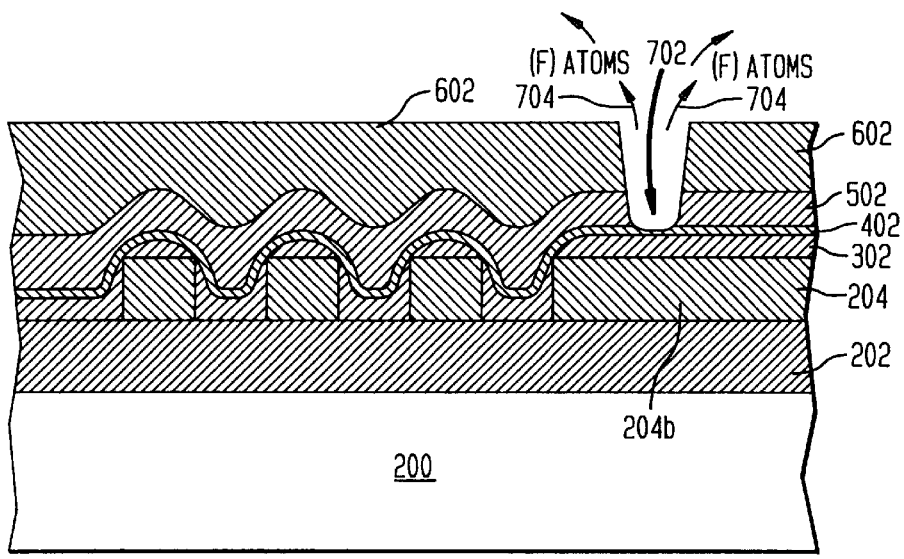
FIGS. 7A, 7B, 7C show cross-sectional views of a semiconductor wafer after etching operations are performed to open a terminal via (TV) through an oxide layer and an HDP oxide layer that overlie a metal fuse structure in accordance with several embodiments of the present invention.

FIG. 7A shows a cross-sectional view of the semiconductor wafer of FIG. 6 after an etching operation is performed to open a terminal via (TV) through the oxide layer 602 and the HDP oxide layer 502. In this embodiment, the fluorine doped HDP oxide layer 402 is well suited to produce an etch stop signal 704 when etching encounters a point 702 in the fluorine doped HDP oxide layer 402. By way of example, the fluorine species in the fluorine doped HDP oxide layer 402 are well suited to provide a detectable signal during the etching process that indicates when etching should stop, such that a desired thickness of oxide remains over the metallization feature 204b (i.e., the metal fuse structure). In addition to providing a good etch stop signal, the fluorine doped HDP oxide layer 402 also provides a significant improvement in stress migration of the metallization layer 204. As a result, the intermetal dielectric (IMD) layers 302, 304, 305, and 602 also benefit by having less compressive stress than undoped HDP oxide materials. Accordingly, an etch stop signal 714 that is in the form of increased phosphorous atoms will indicate that a point 702 has been reached within the terminal via (TV).

In one embodiment, dry plasma etching operations are preferably used to form the terminal vias. By way of example, the dry etching may be performed in an Applied Materials MxP+ chamber by implementing either an $O_2/CHF_4$ or a $CF_4/Ar$ chemistry. The exemplary recipes for each chemistry are shown below in Table A and Table B, respectively.

TABLE A

Exemplary Etch Chemistry $O_2/CHF_3$
Etch Tool: Applied Materials MxP+

|  | RF Power (watts) | Flow Rate | | Pressure | Temp |
|---|---|---|---|---|---|
| Preferred Range | 100 to 3500 | 0–100 sccms $O_2$ | 0–100 sccms $CHF_2$ | 5 to 1000 mTorr | 0° C. to 1000° C. |
| More Preferred Range | 500 to 1500 | 0–30 sccms $O_2$ | 5–20 sccms $CHF_3$ | 20 to 120 mTorr | 5° C. to 30° C. |
| Most Preferred Range | 1000 | 0 sccms $O_2$ | 10 sccms $CHF_3$ | 40 mTorr | 15° C. |

TABLE B

Exemplary Etch Chemistry $CF_4/Ar$
Etch Tool: Applied Materials MxP+

|  | RF Power (watts) | Flow Rate | | Pressure | Temp |
|---|---|---|---|---|---|
| Preferred Range | 100 to 3500 | 0–200 sccms $CF_4$ | 0–300 sccms Ar | 5 to 1000 mTorr | 0° C. to 1000° C. |
| More Preferred Range | 500 to 1500 | 40–80 sccms $CF_4$ | 50–200 sccms Ar | 20 to 120 mTorr | 5° C. to 30° C. |
| Most Preferred Range | 1000 | 60 sccms $CF_4$ | 100 sccms Ar | 40 mTorr | 15° C. |

Figure 7B:
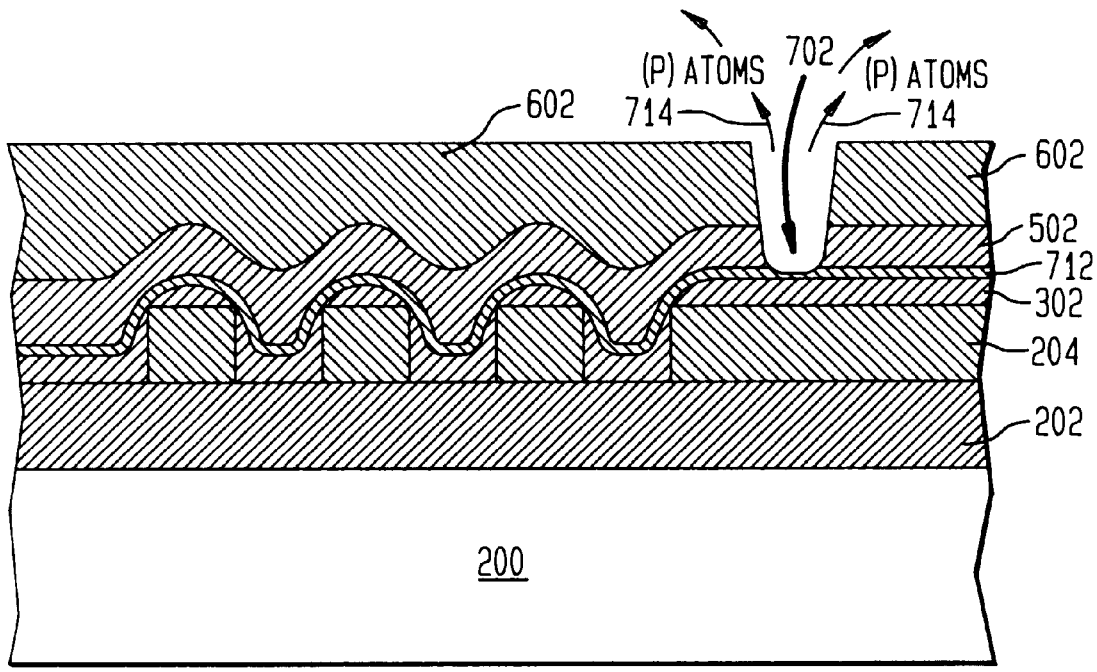

FIG. 7B shows a cross-sectional view of the semiconductor wafer 200 in accordance with an alternative embodiment of the present invention. In this embodiment, the fluorine doped HDP oxide layer 402 is replaced with a phosphorous (P) doped HDP oxide layer 712. The phosphorous doped HDP oxide layer 722 is preferably deposited to a thickness of between about 100 angstroms and about 2,000 angstroms, and more preferably between about 300 angstroms and about 1,000 angstroms, and most preferably, about 500 angstroms. The concentration of phosphorous is preferably selected to be between about 3% wt. and about 20% wt., and more preferably between about 6% wt. and about 12% wt., and most preferably, about 9% wt. As in the prior example of FIG. 7A, the phosphorous doped HDP oxide layer 712 provides a good etch-stop signal 714 when etching commences into layer 712 at a point 702 within the terminal via (TV). Generally, the etch stop signal will be in the form of an increase detection of phosphorous atoms within the plasma etching chamber. Although an HDP-type oxide is deposited for layer 712, other oxides, such as a CVD oxide and PECVD oxide may also be deposited as a doped material with the above-identified concentrations.

Figure 7C:
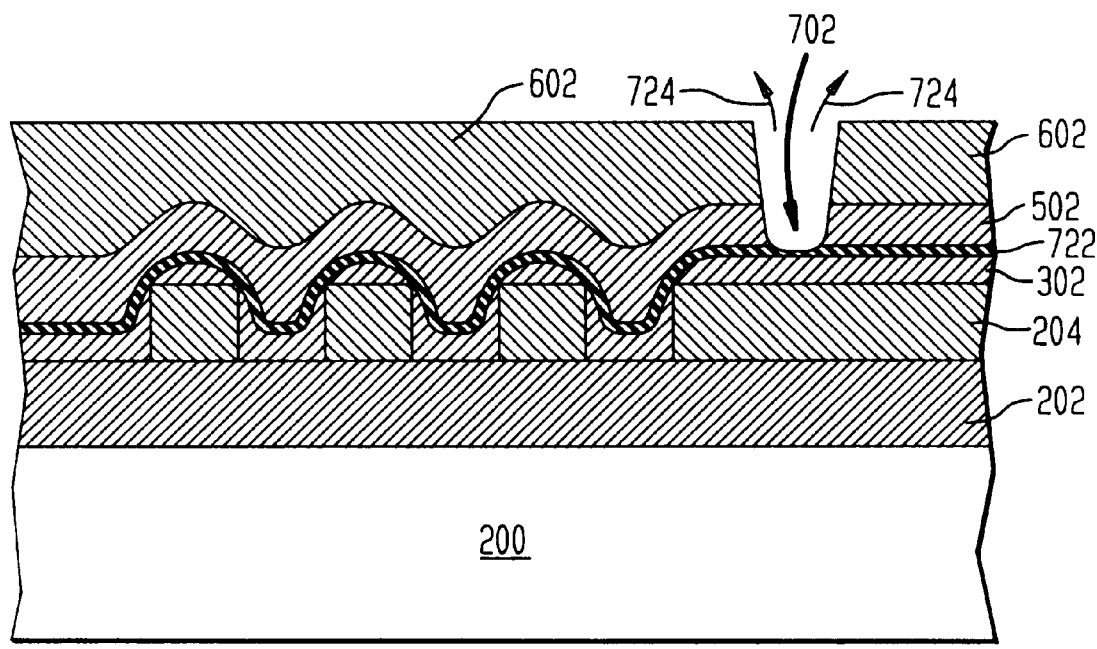

FIG. 7C shows a cross-sectional view of the semiconductor wafer 200 in accordance with yet another alternative embodiment of the present invention. In this embodiment, the phosphorous (P) doped HDP oxide layer 712 is replaced with a tensile stress spin-on-glass (SOG) layer 722. Preferably, the tensile stress SOG layer 722 is an Organix SOG available from Allied Signal of Sunnyvale, Calif., an Organic SOG available from Dow Corning of Auburn, Mich., or any other SOG material having tensile stress or less compressive stress than a pure HDP oxide material.

In this embodiment, the tensile stress SOG layer 722 is preferably deposited to a thickness of between about 100 angstroms and about 2,000 angstroms, and more preferably between about 300 angstroms and about 1,000 angstroms, and most preferably, about 500 angstroms. Once applied to a desired thickness, the tensile stress SOG layer is cured before the HDP oxide layer 502 is deposited. As in the prior examples of FIGS. 7A and 7B, the tensile stress SOG layer 722 provides a good etch-stop physical barrier during terminal via (TV) formation when a selective plasma etching operation is performed.

That is, the tensile stress SOG layer 722 serves to both reduce the compressive stress of the intermetal dielectrics (i.e., layers 302, 502 and 602) and provides a good physical etch stop. Advantageously, the physical etch stop will ensure that at least between about 500 angstroms and about 5,000 angstroms, and more preferably between about 1,000 angstroms and 3,000 angstroms, and most preferably about 2,000 angstroms of oxide remains over a metal fuse structure (e.g., that may be patterned from metallization layer 204).

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method of forming a terminal via in a fuse structure, comprising:

forming the fuse structure from a metallization layer;

depositing a bottom oxide layer over the fuse structure that is formed from the metallization layer;

depositing a doped oxide layer over the base oxide layer;

depositing a top oxide layer over the doped oxide layer;

etching through the top oxide layer;

detecting an increased level of a dopant species that is emitted when the doped oxide layer begins to etch; and terminating the etching when the increased level of dopant species is detected, such that at least the bottom oxide layer remains over the fuse structure that is formed from the metallization layer.

2. A method of forming a terminal via in a fuse structure as recited in claim 1, wherein the bottom oxide layer has a thickness of between about 500 angstroms and about 2,000 angstroms.

3. A method of forming a terminal via in a fuse structure as recited in claim 2, wherein the doped oxide layer is a high density plasma oxide that is doped with a fluorine dopant.

4. A method of forming a terminal via in a fuse structure as recited in claim 2, wherein the fluorine concentration is selected between about 2% wt. and about 20% wt.

5. A method of forming a terminal via in a fuse structure as recited in claim 2, wherein the doped oxide layer is a high density plasma oxide that is doped with a phosphorous dopant.

6. A method of forming a terminal via in a fuse structure as recited in claim 5, wherein the phosphorous concentration is selected between about 3% wt. and about 20% wt.

7. A method of forming a terminal via in a fuse structure as recited in claim 3, wherein the etching is performed in a plasma etching chamber using an etching chemistry selected from the group of a $CHF_3/O_2$ chemistry and a $CF_4/Ar$ chemistry.

8. A method of forming a terminal via in a fuse structure as recited in claim 7, further comprising:

setting a pressure in the plasma etching chamber to be between about 20 mTorr and about 120 mTorr.

9. A method of forming a terminal via in a fuse structure as recited in claim 8, further comprising:

setting a temperature in the plasma etching chamber to be between about 5 degrees Celsius and about 30 degrees Celsius.

10. A method of forming a terminal via in a fuse structure as recited in claim 9, wherein when the $CHF_3/O_2$ chemistry is selected, the method further comprises:

flowing $CHF_3$ at a rate of between about 5 and about 20 sccms; and flowing $O_2$ at a rate of between about 0 and about 30 sccms.

11. A method of forming a terminal via in a fuse structure as recited in claim 9, wherein when the $CF_4/Ar$ chemistry is selected, the method further comprises:

flowing $CF_4$ at a rate of between about 40 and about 80 sccms; and flowing Ar at a rate of between about 50 and about 200 sccms.

12. A method of forming a terminal via in a fuse structure as recited in claim 9, wherein the fuse structure formed in a DRAM circuit.

* * * * *